United States Patent [19]
Unruh

[11] Patent Number: 5,420,171
[45] Date of Patent: May 30, 1995

[54] UV CURABLE TEMPORARY SOLDER MASK

[75] Inventor: Greg R. Unruh, Amarillo, Tex.

[73] Assignee: Tech Spray, Inc., Amarillo, Tex.

[21] Appl. No.: 815,427

[22] Filed: Dec. 31, 1991

[51] Int. Cl.$^6$ .................. G03F 7/028; C08K 5/42; C08K 5/15; G03C 1/805

[52] U.S. Cl. .................... 522/44; 522/74; 522/75; 522/72; 522/77; 522/53; 522/78; 522/79; 522/80; 522/83; 522/114; 522/116; 522/120; 522/121; 430/281; 430/282; 430/284

[58] Field of Search .......... 522/44, 72, 79, 80, 522/83, 85, 71, 74, 75, 78, 77, 96, 53, 114, 116, 120, 121; 430/281, 282, 284

[56] References Cited

U.S. PATENT DOCUMENTS

| | | | |
|---|---|---|---|
| 4,390,401 | 6/1983 | Costanza | 522/181 |
| 4,506,004 | 3/1983 | Sullivan | 430/312 |
| 4,514,271 | 4/1985 | Williams et al. | 522/96 |
| 4,713,298 | 12/1987 | Hung et al. | 428/461 |
| 4,717,643 | 1/1988 | Scheve et al. | 522/96 |
| 4,732,829 | 3/1988 | Sullivan | 430/11 |
| 4,752,553 | 1/1988 | Sullivan | 522/96 |
| 4,826,705 | 5/1989 | Drain et al. | 522/96 |
| 4,964,938 | 10/1990 | Bachmann et al. | 156/273.7 |
| 4,966,827 | 10/1990 | Sullivan | 430/270 |
| 5,006,436 | 4/1991 | Hung et al. | 430/284 |

*Primary Examiner*—Susan W. Berman
*Attorney, Agent, or Firm*—William D. Jackson; Harris, Tucker & Hardin

[57] ABSTRACT

A UV curable organic solvent soluble, aqueous nonalkaline soluble and peelable temporary solder mask composition to be applied to a surface to be protected, having a reactive diluent monomer capable of polymerization upon exposure to ultraviolet light and a photoinitiator serving as a free radical source to initiate polymerization.

12 Claims, No Drawings

UV CURABLE TEMPORARY SOLDER MASK

TECHNICAL FIELD OF THE INVENTION

This invention relates to UV curable temporary solder masks. In one aspect, it relates to a novel composition for application to a surface to be protected from solder during soldering processing and a process for removing the composition from the protected surface.

BACKGROUND OF THE INVENTION

Temporary solder masks provide a coating material used to mask or to protect selected areas of a printed circuit board from the action of an etchant, solder, or plating. Specifically, a temporary solder mask is a coating which masks off a printed circuit board surface and prevents those areas from accepting any solder during vapor phase or wave soldering processing. A prime function of a temporary solder mask is to restrict the molten solder pick up or flow to those areas of the printed circuit board, holes, pads and conductor lines that are not covered by a permanent solder mask.

A distinction is made between permanent and temporary solder masks. Permanent solder mask compositions, which consist of tri- or poly-functional monomers, are highly cross-linked upon curing via ultraviolet light or electron beam. This cross-linking prevents permanent solder masks from being soluble in organic solvents or water.

On the other hand, temporary solder mask compositions do not contain tri- or poly-functional monomers and therefore do not cross-link upon curing. Rather, temporary solder mask compositions, upon curing, undergo a linear polymerization reaction, thus allowing the temporary mask to be soluble in organic solvents, water or even to be peeled off of a circuit board. The solubility or lack thereof of temporary and permanent solder masks is crucial to the utilization of these masks in the electronic industry. Temporary masks are applied to a selected or limited area of a printed circuit board to protect certain holes or features such as connector fingers from accepting solder. The temporary mask keeps solder out of the selected holes and thus allows for certain process or temperature sensitive components to be added manually at a later time. In contrast, permanent solder masks are not removed and thus become an integral part of the printed circuit board from the very beginning of its application to the board.

The more commonly seen solvent soluble mask is the inorganic extenders and/or organometallic salts. These formulas may consist of low molecular weight acrylic homopolymers extended with aluminum oxide, calcium carbonate or titanium dioxide along with plasticizers and carried in a chlorinated, aromatic or low molecular weight aliphatic solvent. Some formulations have substituted calcium octoate, zinc octoate, aluminum octoate or various inorganic stearate salts for the acrylic polymer.

Although inorganically extended solder masks apply, cure, and wash fairly well, a major problem exists with respect to contamination. The inorganic extenders, being insoluble in the cleaning solvent, tend to plug filters, collect in boiling sumps and generally harass cleaning systems. Being partially solvent soluble, the organometallic components (e.g., calcium octoate) tend to form micro-gels when present in high enough concentrations. When these gelled-aggregates become large enough, they can also plug solvent filters and will tend to settle out and collect in sumps.

However, the worst aspect of this type of mask with respect to contaminations is the deleterious effects on flux and solder. Flux is an acidic compound that removes oxides from metals and prepares the surface of a printed circuit board for soldering. Being ionic in nature, this type of mask has the potential to reek havoc on flux with activators through simple ion exchange at elevated temperatures. Potential post solder/wash contamination of printed circuit boards can also present problems.

A further problem is that the current technology uses solvent borne thermal cure masks which require evaporation of the carrier solvent to occur before the mask is cured and ready for use. This process can take anywhere from 1-24 hours. Also, these carrier solvents pose a high environmental risk upon evaporation. With respect to the previous existing thermal cure masks, they possess material which is only 30–60% active, the remaining being water or solvent carrier. Thus, with these thermal systems, the solvent or water must be evaporated. With solvent systems, this evaporation creates health and environmental hazards because the solvents used for polymer solubilization are toxic (e.g., acetone, toluene, xylene, etc.). In fact, many states within the United States have passed legislation prohibiting direct evaporation of such toxic solvents into the air.

On the other hand, in the present invention, the UV cure materials are 100% active, that is, the materials are not carried in a solvent and, all of the material reacts or polymerizes, leaving minimal or no volatile organic compounds.

Accordingly, it is an object of this invention to provide a UV curable temporary solder mask that, after application to a surface to be protected, may be cured in approximately. 5–45 seconds, depending upon the user's needs, using an ultraviolet radiation source having a wave length in the A range. This temporary solder mask may be applied robotically, manually or by silkscreen/template methods. This unique solder mask is ready for soldering operation immediately following the cure procedure and provides complete protection to desired areas, will withstand temperatures of up to 650° F. and can be removed without leaving any residue. Furthermore, the present invention is not carried in a solvent and is 100% active. Therefore there are minimal health and environmental concerns. Also, this invention may be removed from the surface to be protected by either dissolving this temporary mask in an aqueous nonalkaline solution, an organic solvent or peeling the mask off of the protected surface.

These and other objects and features of the invention will be made apparent from the following description of the invention.

SUMMARY OF THE INVENTION

In one aspect of the present invention, a composition is provided that is a UV curable temporary solder mask which includes a) a photoinitiator; b) an antioxidant; c) a reactive diluent monomer capable of polymerization; and d) a thickener. Specifically, there are three types of temporary solder mask compositions, including solvent soluble, water soluble and peelable.

These compositions are applied to a surface that is to be protected, for example, a surface that has to be protected from solder during soldering processing. Thereafter, these compositions are cured by exposing them to ultraviolet light. The general objective of the curing process is to remove any volatiles and to chemically polymerize the temporary solder mask. After curing, the compositions are removed from the surface that is to be protected by either dissolving the composition in an aqueous nonalkaline solution, organic solvent, or peeling the composition off of the surface that is to be protected.

DETAILED DESCRIPTION

Generally, the present invention provides for a UV curable temporary solder mask composition. This general composition may comprise the following ingredients in the percentages indicated:

| Ingredient | Effective % by Weight |
| --- | --- |
| Reactive diluent monomer | 5–90 |
| Thickener | 1–15 |
| Anti-oxidant | 0.01–2 |
| Photoinitiator | 1–10 |

The composition may further include additional ingredients. The reactive diluent monomer of the above composition may be a substituted vinyl monomer, including tetrahydrofurfuryl-methacrylate, tetrahydrofurfurylacrylate, allyl methacrylate, n-alkyl methacrylate ($C_2$–$C_{18}$), 2-ethoxyethyl acrylate, isodecyl methacrylate, lauryl methacrylate, 2-phenoxyethyl acrylate, benzyl acrylate, isobornyl methacrylate, isobornyl acrylate, isodecyl acrylate, isoctyl acrylate, and compositions similar thereto.

The anti-oxidant present in the above composition may include naphthoquinone, benzoquinone, alkyl or aryl-substituted naphthoquinones or alkyl or aryl-substituted benzoquinones, and similar compositions thereto.

The photoinitiator of the above composition may include substituted benzophenones or substituted thioxanthones, and similar compositions thereto. For example, photoinitiators may be used like that found in U.S. Pat. Nos. 3,715,293 and 3,801,329, the disclosures of which are hereby incorporated by reference. A preferred photoinitiator in the present invention is 2,2-dimethoxy-2-phenylacetophenone, and like compounds, having the following chemical structure:

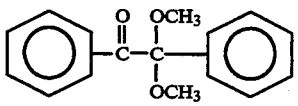

The photoinitiator serves as a free radial source to initiate polymerization of the composition.

The thickeningagent present in the above composition may be an organic sulfonate. Other suitable thickening agents include attapulgite clay, silicon dioxide, carboxymethyl cellulose, carboxyethyl cellulose, xantham gum, or acacia gum and similar compositions thereto.

More specifically, the present invention provides for a UV curable temporary solder mask that is peelable from the protected surface. The composition of this peelable temporary solder mask may be as follows:

| Ingredient | Effective % by Weight | Preferred % by weight |
| --- | --- | --- |
| Reactive diluent monomer | 5–35 | 15–25 |
| Oligomer | 50–70 | 55–65 |
| Release agent | 0.5–5 | 1.5–3 |
| Plasticizer | 5–15 | 4–10 |
| Thickener | 1–15 | 3–8 |
| Anti-oxidant | 0.01–2 | 0.05–0.15 |
| Photoinitiator | 1–10 | 2–6 |

The reactive diluent monomer present in the above composition include substituted vinyl monomers. For example, tetrahydrofurfuryl-methacrylate, tetrahydrofurfuryl-acrylate, allyl methacrylate, n-alkyl methacrylate ($C_2$–$C_{18}$),2-ethoxyethyl acrylate, isodecyl methacrylate, lauryl methacrylate, 2-phenoxyethyl acrylate, benzyl acrylate, isobornyl methacrylate, isobornyl acrylate, isodecyl acrylate, and isooctyl acrylate, and compositions similar thereto.

The oligomer present in the above composition may be a urethane acrylate. These include urethane diacrylate, isoprene oligomer, butadiene oligomer, styrene-butadiene oligomer, isoprene monomer, polyisoprene and polybutadiene, and compositions similar thereto.

The release agent of the above composition includes low, medium and high molecular weight silicone oil or low, medium or high molecular weight mineral oil. This release agent facilitates the peeling off of the cured mask from the protected surface.

The plasticizer element of the above composition may be a phthalate ester which include diarylphthalate esters, dialkylphthalate esters, alkyl arylphthalate esters, and similar compositions thereto, where alkyl may have 2 to 12 carbons and aryl may be of phenyl, benzyl, substituted phenyl or substituted benzyl.

The thickening agent present in the above composition may be an organic sulfonate. A attapulgite clay, silicon dioxide, carboxymethyl cellulose, carboxyethyl cellulose, xanthan gum, or acacia gum and similar compositions thereto may also be used.

The antioxidant of the above composition helps in the prevention of monomer/oligomer oxidation. There are numerous antioxidants from which to choose, including naphthoquinone, benzoquinone, alkyl or aryl-substituted naphthoquinones or alkyl or aryl-substituted benzoquinones, and compositions similar thereto, as described above.

The peelable UV curable temporary solder mask also comprises a photoinitiator which serves as a free radical source to initiate polymerization of the composition. The photoinitiator may be comprised of a substituted benzophenone or a substituted thioxanthone and similar compositions thereto.

The present invention also provides for a UV curable water soluble temporary solder mask, the typical composition of which is as follows:

| Ingredient | Effective % by Weight | Preferred % by weight |
| --- | --- | --- |
| Reactive diluent monomer | 5–50 | 35–45 |
| Surfactant | 0.5–5 | 1–2 |
| Antioxidant | 0.01–2 | 0.05–0.15 |
| Photoinitiator | 1–10 | 1.5–4 |
| Water soluble polymer | 55–75 | 45–55 |

| Ingredient | Effective % by Weight | Preferred % by weight |
|---|---|---|
| Thickener | 1–10 | 2–6 |

The reactive diluent monomer present in the above composition comprises the same compounds that make up the reactive diluent monomer present in the peelable UV curable temporary solder mask, as put forth above.

The surfactant that is present in the water soluble temporary solder mask may be comprised of any nonionic surface active agent with a hydrophilic-lipophilic balance greater than 10.00. The surfactant helps in solubilization.

The antioxidant contained within the water soluble UV curable temporary solder mask comprises the same compounds that make up the antioxidant in the peelable UV curable temporary solder mask.

The water soluble polymer present in the water soluble UV curable temporary solder mask may be a polyvinyl pyrollidone with a molecular weight between 15,000–50,000. These include polyvinyl alcohols, polyvinyl ammonium acrylate, polyvinyl sodium acrylate, polyvinyl potassium acrylate, polyvinyl trialkyl ammonium acrylate, polyvinyl dialkyl ammonium acrylate, polyvinyl monoalkyl ammonium acrylate and similar compounds thereof.

The thickener present in the water soluble UV curable temporary solder mask is similar to that present in the peelable UV curable temporary solder mask, an organosulfonate.

Further, the photoinitiator contained in the water soluble UV curable temporary solder mask may be a substituted benzophenone or a substituted thioxanthone or similar compositions thereto, as described above.

The present invention provides for yet another composition which is a UV curable solvent soluble temporary solder mask, which has a typical composition as follows:

| Ingredient | Effective % by Weight | Preferred % by Weight |
|---|---|---|
| Reactive diluent monomer | 75–90 | 80–85 |
| Thickener | 1–15 | 4–10 |
| Antioxidant | 0.01–2 | 0.05–0.15 |
| Photoinitiator | 1–10 | 2–6 |

The reactive diluent monomer present in the solvent soluble UV curable temporary solder mask includes N-alkylmethacrylate ($C_2$–$C_{18}$), N-alkylacrylate ($C_2$–$C_{18}$). cyclohexyl acrylate, cyclohexyl methacrylate, isodecyl acrylate, isodecyl methacrylate, isooctyl acrylate, isooctyl methacrylate, benzyl acrylate, isobornyl methacrylate, isobornyl acrylate, and compositions similar thereto.

The thickener and antioxidants present in the solvent soluble UV curable temporary solder mask are the same or similar to compositions present in the peelable and water soluble UV curable temporary solder mask, as explained above.

The anti-oxidant contained within the solvent soluble UV curable temporary solder mask comprises the same compounds that make up the anti-oxidant in the peelable UV curable temporary solder mask.

The photoinitiator contained within the solvent soluble UV curable temporary solder mask may be comprised of a substituted benzophenone or a substituted thioxanthone and similar compositions thereto, as described above.

Either of the above compositions may be applied manually, robotically or by template/screening to a surface that is to be protected. After the composition is applied, it is exposed to ultraviolet light with a wavelength in the A range wherein the composition undergoes a polymerization or curing process. This polymerization or curing may be between 5–45 seconds. Thereafter, the composition may be removed from the protected surface. The water soluble composition is removed from the protected surface by dissolving the composition in an aqueous nonalkaline solution. The solvent soluble composition is removed from the protected surface by dissolving the composition in an organic solvent, specifically, alcohols, ketones, esters, aromatics, chlorocarbons, chlorofluorocarbons, hydrido chlorofluorocarbons, or a mixture thereof, whereas the peelable composition is removed from the protected surface by peeling it off of the surface.

EXAMPLES

Example One

| Ingredient | | Preferred % by Weight |
|---|---|---|
| Tetrahydrofurfuryl methacrylate | (Reactive diluent monomer) | 17.6 |
| Urethane Diacrylate | (Oligomer) | 62.0 |
| 350 CS Silicon fluid | (Release agent) | 2.0 |
| Benzoylbutylphthalate | (Plasticizer) | 8.2 |
| Attapulgite clay | (Thickener) | 5.1 |
| Naphthoquinone | (Anti-oxidant) | 0.10 |
| 2,2-dimethoxy-2-phenylacetophenone | (Photoinitiator) | 2.5 |

The above ingredients were simultaneously mixed together for a sufficient amount of time to produce a homogenous temporary solder mask mixture. Thereafter, the mask was transferred to a syringe and manually applied over solder pads on a printed circuit board. After application, the mask was cured by exposing it to ultraviolet light in the power range of 180 mw/cm$^2$. The focal length was three inches and the ultraviolet light was in the A wave range. The mask was cured in 10 seconds. Subsequently, a solder flux was applied to the printed circuit board by spray bottle and allowed to dry in an oven at 250° F. for five minutes. The printed circuit board was then dragged through a static solder pot for two seconds at 510° F. Thereafter, the mask was removed by peeling the mask off of the printed circuit board. There were no adverse environmental or health hazards, nor were there any deleterious effects on the flux and solder.

Example Two

| Ingredient | | Preferred % by Weight |
|---|---|---|
| Vinylpyrollidone | (Reactive diluent monomer) | 40.9 |
| Ethoxylated Nonylphenol | (Surfactant) | 1.50 |
| Benzoquinone | (Anti-oxidant) | 0.10 |
| 2,2-dimethoxy-2-phenylacetophenone | (Photoinitiator) | 2.0 |
| Polyvinylpyrollidone | (Water soluble polymer) | 51.5 |

| Ingredient | | Preferred % by Weight |
|---|---|---|
| Silicon dioxide | (Thickener) | 4.0 |

The above ingredients were simultaneously mixed together for a sufficient amount of time to produce a homogenous temporary solder mask mixture. Thereafter, the mask was transferred to a syringe and manually applied over finger connectors on a printed circuit board. After application, the mask was cured by exposing it to ultraviolet light in the power range of 180 mw/cm$^2$. The focal length was three inches and the ultraviolet light was in the A wave range. The mask was cured in 10 seconds. Subsequently, a solder flux was applied to the printed circuit board by spray bottle and allowed to dry in an oven at 250° F. for five minutes. The printed circuit board was then dragged through a static solder pot for two seconds at 510° F. Thereafter, the mask was removed by dissolving the mask in water at a temperature of 120°-140° F. under pressure of 60 psi. There were no adverse environmental or health hazards, nor were there any deleterious effects on the flux and solder.

Example Three

| Ingredient | | Preferred % by Weight |
|---|---|---|
| 3,3,5-trimethyl-cyclohexyl acrylate | (Reactive diluent monomer) | 89.4 |
| Silicon dioxide | (Thickener) | 7.5 |
| Naphthoquinone | (Antioxidant) | 0.1 |
| 2,2-dimethoxy-2-phenylacetophenone | (Photoinitiator) | 3.0 |

The above ingredients were simultaneously mixed together for a sufficient amount of time to produce a homogenous temporary solder mask. Thereafter, the mask was transferred to a syringe and manually applied over solder pads on a printed circuit board. After application, the mask was cured by exposing it to ultraviolet light in the power range of 180 mw/cm$^2$. The focal length was three inches and the ultraviolet light was in the A wave range. The mask was cured in 10 seconds. Subsequently, a solder flux was applied to the printed circuit board by spray bottle and allowed to dry in an oven at 250° F. for five minutes. The printed circuit board was then dragged through a static solder pot for two seconds at 510° F. Thereafter, the mask was removed by dissolving the mask in chlorofluorocarbon. There were no adverse environmental or health hazards, nor were there any deleterious effects on the flux and solder.

Although the present invention has been described with respect to a preferred embodiment and alternative embodiments, various changes, substitutions and modifications of these may be suggested to one skilled in the art, and it is intended that the present invention encompass such changes, substitutions and modifications as fall within the scope of the appended claims.

I claim:

1. A UV curable temporary solder mask composition to be applied to a surface to be protected from solder during soldering processing, comprising:
   a) 5-50% by weight of a reactive diluent monomer;
   b) 0.5-5% by weight of a surfactant;
   c) 0.01-2% by weight of an anti-oxidant;
   d) 45-55% by weight of a water soluble polymer;
   e) 1-10% by weight of a thickener; and
   f) 1-10% by weight of a photoinitiator;
   said composition, after curing with ultra violet radiation to provide a cured solid solder mask which is resistent to solder applied at a temperature of 510° F. being characterized as soluble in an aqueous nonalkaline solution.

2. A composition as in claim 1, wherein said composition has a cure time between about 5-45 seconds when exposed to ultraviolet radiation, wherein said ultraviolet radiation has a wavelength in the A range.

3. A composition as in claim 1, wherein said monomer is a substituted vinyl monomer selected from a group consisting of tetrahydrofurfuryl-methacrylate, tetrahydrofurfuryl-acrylate, allyl methacrylate, n-alkyl methacrylate, ($C_2$-$C_{18}$), 2-ethoxyethyl acrylate, isodecyl methacrylate, lauryl methacrylate, 2-phenoxyethyl acrylate, benzyl acrylate, isobornyl methacrylate, isobornyl acrylate, isodecyl acrylate, and isoctyl acrylate.

4. A composition as in claim 1, wherein said surfactant is selected from a group consisting of nonionic compounds with a hydrophilic-lipophilic balance between about 10-14.

5. A composition as in claim 1, wherein said polymer is selected from a group consisting of polyvinyl compounds with a molecular weight between about 15,000-50,000 atomic mass units.

6. A composition as in claim 1, wherein said thickener is selected from a group consisting of organosulfonates.

7. A composition as in claim 1, wherein said photoinitiator is selected from group consisting of substituted thioxanthone or substituted benzophenone.

8. A UV curable temporary solder mask composition for application to a surface to be protected from solder during soldering processing, comprising:
   a) 75-90% by weight of a reactive diluent monomer;
   b) 1-15% by weight of a thickener;
   c) 0.01-2% by weight of an anti-oxidant; and
   d) 1-10% by weight of a photoinitiator;
   said composition, after curing with ultraviolet radiation to provide a cured solid solder mask which is resistant to solder applied at a 510° F., being characterized as soluble in an organic solvent selected from a group consisting of alcohols, ketones, esters, aromatics, chlorocarbons, chlorofluorocarbons, hydrochlorofluorocarbons, or a mixture thereof.

9. A composition as in claim 8, wherein said composition has a cure time between 5-45 seconds when exposed to ultraviolet radiation, wherein said ultraviolet radiation has a wavelength in the A range.

10. A composition as in claim 8, wherein said monomer is a substituted vinyl monomer selected from the group consisting of tetrahydrofurfuryl-methacrylate, tetrahydrofurfuryl-acrylate, allyl methacrylate, n-alkyl methacrylate ($C_2$-$C_{18}$), 2-ethoxyethyl methacrylate, isodecyl methacrylate, lauryl methacrylate, 2-phenoxyethyl acrylate, benzyl acrylate, isobornyl methacrylate, isobornyl acrylate, isodecyl acrylate and isooctyl acrylate.

11. A composition as in claim 8, wherein said thickener is a compound selected from a group consisting of organosulfonates.

12. A composition as in claim 8, wherein said photoinitiator is selected from group consisting of substituted thioxanthone or substituted benzophenone.

* * * * *